(12) United States Patent
Huang

(10) Patent No.: US 6,179,645 B1
(45) Date of Patent: Jan. 30, 2001

(54) HIGH DENSITY ELECTRICAL CONNECTOR ADAPTABLE TO THE WIRES OF DIFFERENT DIAMETERS AND THE METHOD OF MAKING THE SAME

(75) Inventor: Wayne Huang, Alhambra, CA (US)

(73) Assignee: Hon Hai Precision Ind. Co., Ltd., Taipei Hsien (TW)

( * ) Notice: Under 35 U.S.C. 154(b), the term of this patent shall be extended for 0 days.

(21) Appl. No.: 09/427,888

(22) Filed: Oct. 26, 1999

(51) Int. Cl.[7] .................................................. H01R 4/24
(52) U.S. Cl. ............................................. 439/405; 439/76.1
(58) Field of Search ..................................... 439/405, 404, 439/76.1, 610

(56) References Cited

U.S. PATENT DOCUMENTS

| | | | |
|---|---|---|---|
| 4,900,266 | * | 2/1990 | Sainsbury et al. .................... 439/452 |
| 5,421,741 | * | 6/1995 | David et al. ........................... 439/405 |
| 5,425,657 | * | 6/1995 | Davis et al. ........................... 439/405 |

* cited by examiner

*Primary Examiner*—Gary F. Paumen
(74) *Attorney, Agent, or Firm*—Wei Te Chung

(57) ABSTRACT

A high-density electrical connector for electrically connecting a mating electrical connector is equipped with two stepped transmission boards. Each of the transmission boards forms a plurality of first conductive regions and second conductive regions alternatively arranged thereon in different rows and pitches. The first conductive regions are alternatively arranged in a first row in a first pitch for respectively electrically connecting the corresponding terminals. The second conductive regions are alternatively arranged in a second row in a second pitch wider than the first pitch for selectively electrically connecting with the wires of different diameters. Understandably, the second pitch is sufficient to keep spacing each two adjacent wires away from each other, particularly to other wider wires. A plurality of circuit traces build an electrical connecting path between the relative first and second conductive regions.

8 Claims, 7 Drawing Sheets

HIGH DENSITY ELECTRICAL CONNECTOR ADAPTABLE TO THE WIRES OF DIFFERENT DIAMETERS AND THE METHOD OF MAKING THE SAME

BACKGROUND OF THE INVENTION

1. Field of the Invention

The present invention relates to an electrical connector for electrical contact with a mating electrical socket, and particularity to a high-density electrical connector for link with a plurality of wires.

2. The Prior Art

A conventional electrical connector linking with a bunch of wires is commonly equipped with a planar spacer to orient/guide a tail of each of plenty of terminals exposed out of the electrical connector for accurately terminating a conductor of each of the wires. Mostly, the tail of each of the terminals is shaped to a fork-like structure to penetrate an insulative layer of the associated wire so as to engage with said conductor. U.S. Pat. No. 3,820,058 discloses the similar design as aforementioned.

A preferred embodiment in accordance with the present invention indicates a SCSI type plug having plenty of terminals in high-density arrangement, linking with a bunch of wires each having a cross-section of approximate 30 AWG (American Wire Gage). U.S. patent application, filed on Nov. 13, 1998, Ser. No. 09/191,366, assigned to the same assignee as the instant application, entitled to "Method for Terminating Conductors", describes the same type connector which is equipped with two stepped spacers to orient some fork type terminals of a connector for perpendicularly terminating the conductor of the wires. Meanwhile, a plenty of juxtaposed retaining slots defined integrally with each of said spaces to support a fork section of the corresponding terminal on the purpose of reliably and accurately terminating the conductors of the wires. However, such a spacer can be not designated adaptive to other thicker wires, like a 28 AWG wire with a wider cross-section than that of a 30 AWG wire. When the 28 AWG wires are intend to be respectively aligned with the retaining slots of the spacer used for the 30 AWG wires, each two adjacent 28 AWG wires may be interfered with the insulative layer of each other. This is because a distance between each two adjacent retaining slots of the spacer still must meet a specific pitch between each two adjacent terminals of the connector as adopted for 30 AWG wires, which is insufficient to constitute an interval between each two adjacent 28 AWG wires installed with the corresponding retaining slots. U.S. patent application, filed on Aug. 13, 1999, Ser. No. 09/374,397, assigned to the same assignee, entitled to "Spacer for IDC Termination", describes an array of mounting channels longitudinally extending through a spacer, and the fork sections of each of plenty of terminals guided inside a slits defined adjacent to each channel so as to reliably terminate a corresponding wire which is inserted into the channel. Also, the spacer has the same problem as U.S. patent application Ser. No. 09/191, 366. Other designs are shown in U.S. Pat. Nos. 3,760,335, 5,244,420, 5,536,182, 5643,013, 5,760,335, 5,761,805, and 5,766,033.

To resolve the foregoing disadvantage, the present invention discloses an electrical connector equipped with at least a transmission board to electrically interconnect between a plurality of terminals of a connector and a plurality of wires. The transmission board includes several rows of first conductive regions arranged adjacent to a front edge in a first pitch, and several rows of second conductive regions arranged adjacent to a rear edge in a second pitch wider than the first pitch, and a circuit trace formed on a layer of the board for interconnecting between the first and second conductive regions. Meanwhile, the tail sections of the terminals of the connector are respectively soldered with the first conductive regions, and the wires are respectively soldered with the second conductive regions. Therefore, the transmission board is adaptable to selectively link with the wires of different diameters without any modification to the terminal pitch to the connector.

SUMMARY OF THE INVENTION

Accordingly, one object of the present invention is to provide an electrical connector with at least a transmission board adaptable to selectively link with the wires of different diameters without any modification of the terminal pitch in a connector disposed onto the transmission board.

To fulfill the above mentioned objects, according to several preferred embodiments of the present invention, a high-density electrical connector for electrically connecting a mating connector, includes an insulative housing, two stepped transmission boards, a side cover, and a plurality of terminals. The housing integrally forms a mating portion and a joint portion at opposite ends thereof wherein two stepped joint surfaces are formed under the joint portion. A plurality of terminals each including a contact section and a tail section, are received within the insulative housing. Each of the transmission boards forms a plurality of first conductive regions and second conductive regions thereon in different rows and with different pitches. The first conductive regions are alternatively arranged in a first row with a first pitch for respectively electrically connecting the corresponding terminals. The second conductive regions are alternatively arranged in a second row with a second pitch wider than the first pitch for selectively electrically connecting with the wires of different diameters. Actually, the second pitch is sufficient to keep spacing each two adjacent wires away from each other, particularly to other wider wires. A plurality of circuit traces build an electrical connecting path between the relative first and second conductive regions.

DETAILED DESCRIPTION OF THE PREFERRED EMBODIMENTS

Detailed reference will now be made to the preferred embodiments of the present invention.

Figure 1:
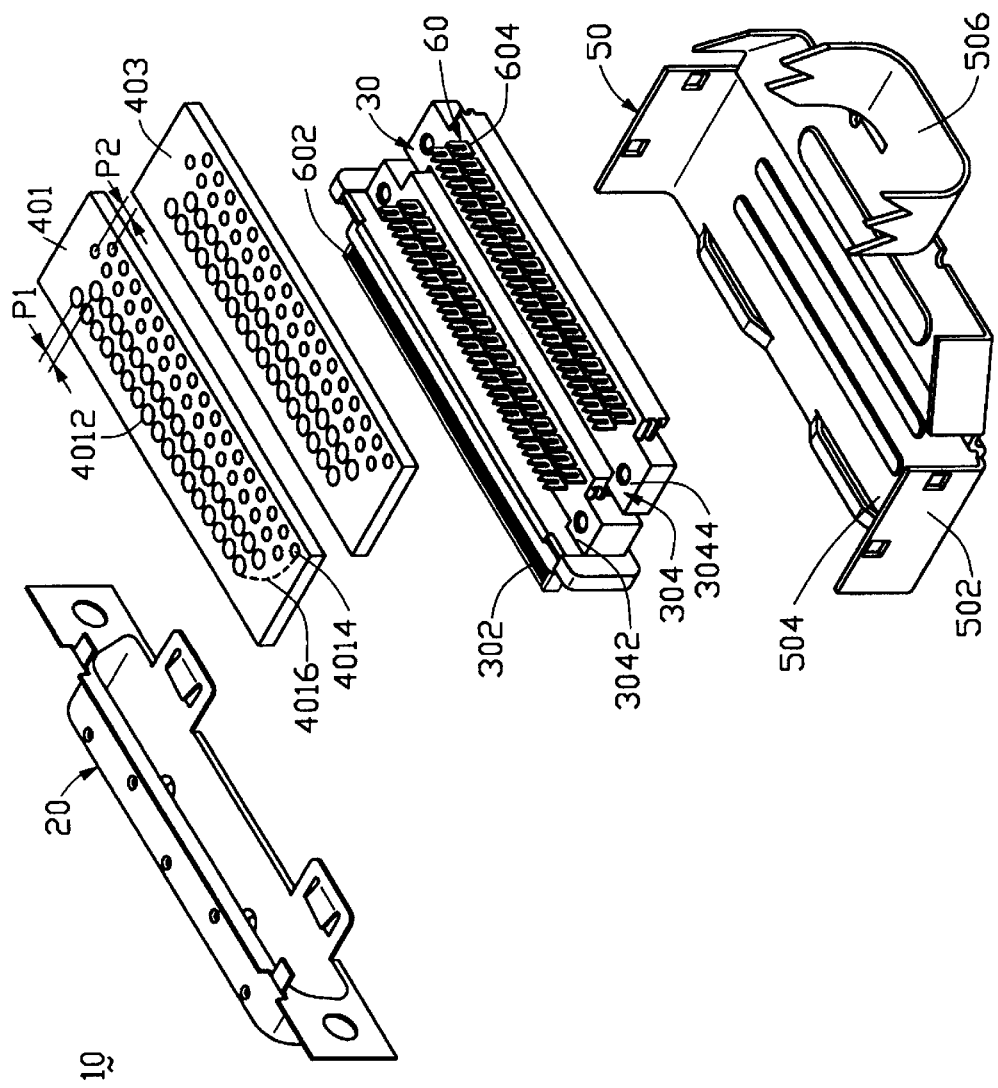
FIG. 1 is an exploded perspective view of an electrical connector of a first preferred embodiment in accordance with the present invention.

Referring to FIG. 1, a high-density electrical connector 10 for electrically connecting a mating connector (not shown) with a cable 70 having a bunch of wires 701 (see FIG. 5), includes a front shelter 20, an insulative housing 30, an upper and lower transmission boards 401, 403, a side cover 50, and a plurality of terminals 60. Meanwhile, each wire 701 shown in FIG. 5 exposes a conductive segment (not labeled) at distal end thereof.

Figure 2:
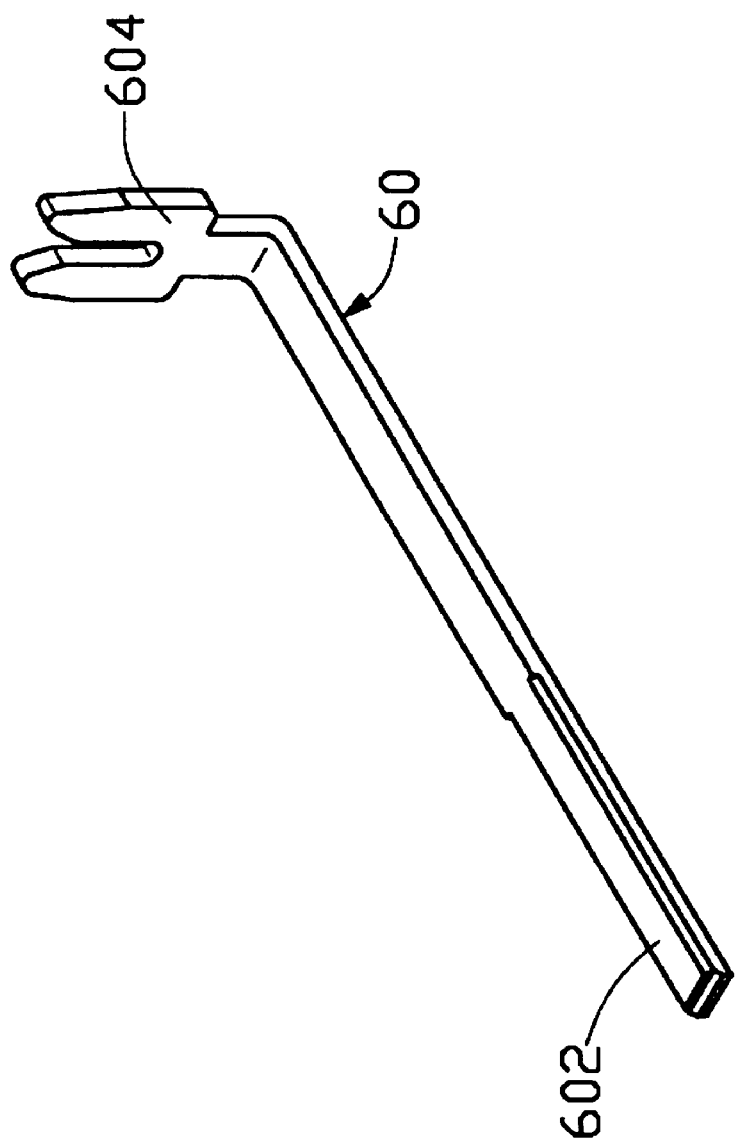
FIG. 2 is a perspective view of a terminal of a connector installed in front of the electrical connector shown in FIG. 1.

Further referring to FIGS. 1 & 2, the housing 30 integrally forms a mating portion 302 and a joint portion 304 at opposite ends thereof wherein two stepped joint surfaces 3042, 3044 are biased on a bottom portion of the joint portion 304. A plurality of terminals 60 each include a contact section 602 and a tail section 604 extending normally of the contact section 602, and are received within the insulative housing 30 by an insert-molding process. It is resulted that the contact sections 602 of the terminals 60 are partially exposed out of the mating portion 302 of the housing 30 in an upper and lower rows for electrically mating with said mating electrical connector, and the tail sections 604 are exposed outside the joint surfaces 3042, 3044 of the joint portion 304 of the housing 30 in rows. The tail section 604 of each of the terminals 60 can be designated to be a bifurcated tip in accordance with a first embodiment of the present invention as shown in FIG. 2, or a single pin 604' in accordance with a second embodiment of the present invention as shown in FIG. 4C. See FIGS. 1, 3 & 4A, each of the transmission boards 401, 403 forms two rows of different conductive regions 4012, 4014 respectively located adjacent to a front and rear edges thereof. A plurality of first conductive regions 4012 are alternatively arranged up and down in the first row in a first pitch P1 for being respectively aligned and electrically connected with the tail sections 604 of the corresponding terminals 60. A plurality of second conductive regions 4014 are alternatively arranged up and down in the second row in a second pitch P2 wider than the first pitch PI for selectively electrically connecting with the conductive segments of the wires of different diameters like the 28 AWG or 30 AWG wires. Actually, the second pitch P2 is sufficient to keep spacing each two adjacent wires away from each other, particularly to other wider wires. It is noted that although the numbers of the first conductive regions 4012 arranged in either of the transmission boards 401, 403 are the same as the second conductive regions 4014, the first conductive regions 4012 are alternatively arranged with respect to the second conductive regions 4014. Understandably, the alternative arrangement of the first and second conductive regions 4012, 4014 can reach a higher density manner. A plurality of circuit traces 4016 build an electrical connecting path between the relative first and second conductive regions 4012, 4014. Only one of the circuit trace 4016 is presented in FIGS. 1 & 3.

Figure 3:
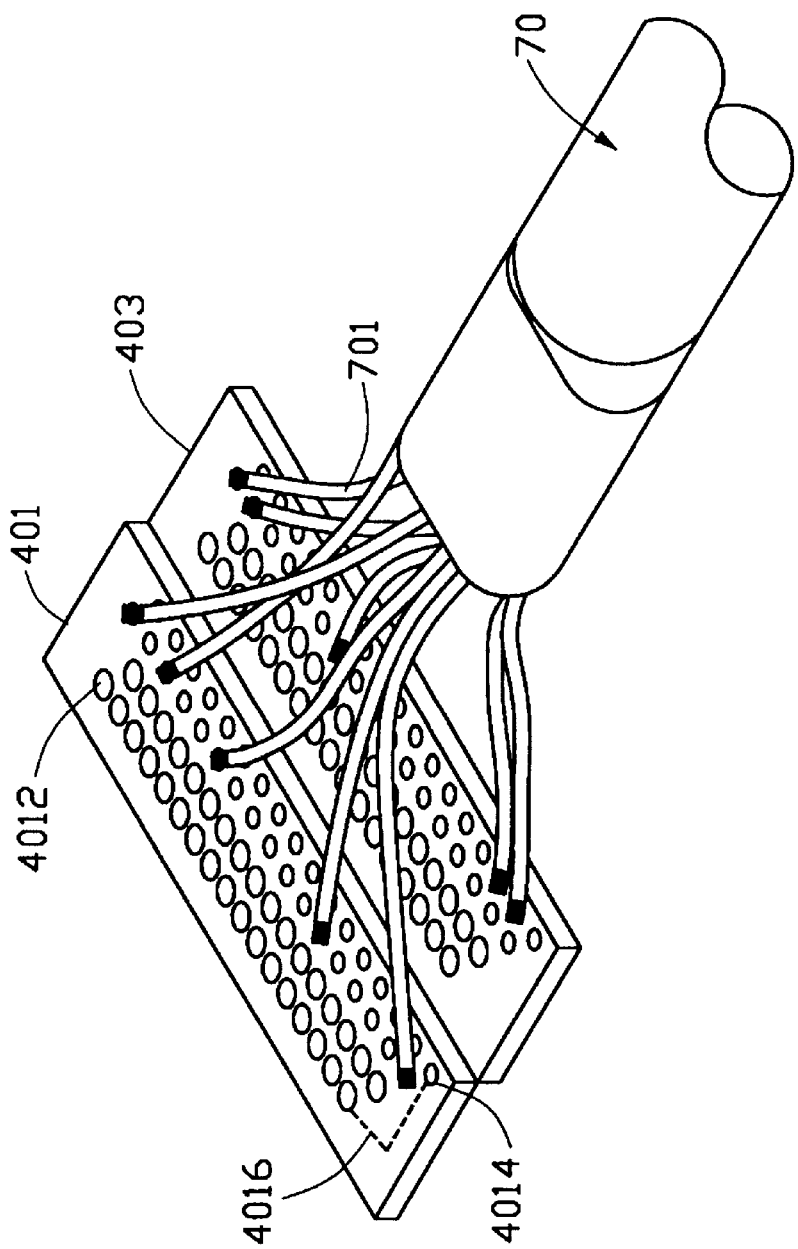
FIG. 3 is a perspective view of a bunch of wires of the electrical connector shown in FIG. 2 showing two stepped transmission boards linking with the corresponding wires.
Figure 6:
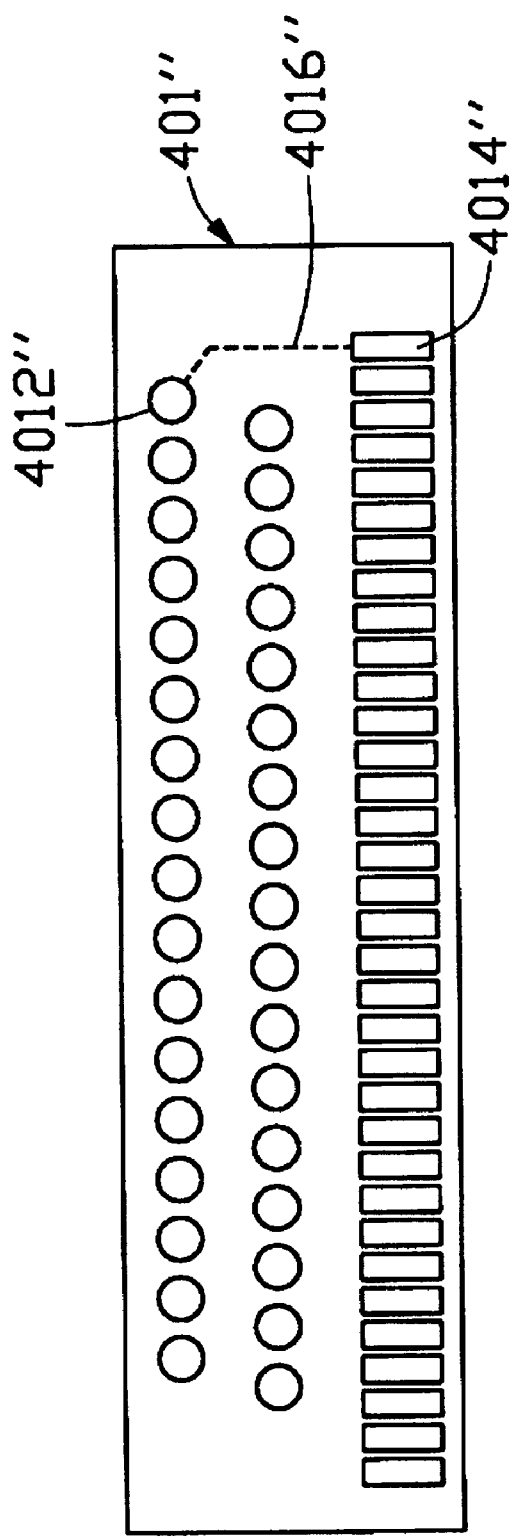
FIG. 6 is a top view of a transmission board of a third embodiment in accordance with the present invention.

It is noted in the first embodiment shown in FIGS. 1 & 3, a first hole is defined inside each first conductive region 4012, and a second hole is defined inside each second conductive region 4014. In comparison with the first embodiment, a third embodiment of the present invention as shown in FIG. 6 indicates a difference that a plurality of pads 4014" as being the second conductive regions arranged in alignment, instead of the alternative arrangement of the second holes. The aligned arrangement of the pads can shorten the wide of the entire transmission board 401".

Further referring to FIG. 1, the side cover 50 made of a metallic piece integrally forms thereon two opposite walls 502, a receiving space 504 defined between the walls 502, and a wire harness 506 located a rear portion thereof. The side cover 50 is capable to be secured to the joint portion 304 of the housing 30 at a position opposite to the joint surfaces 3042, 3044.

Figure 4A:
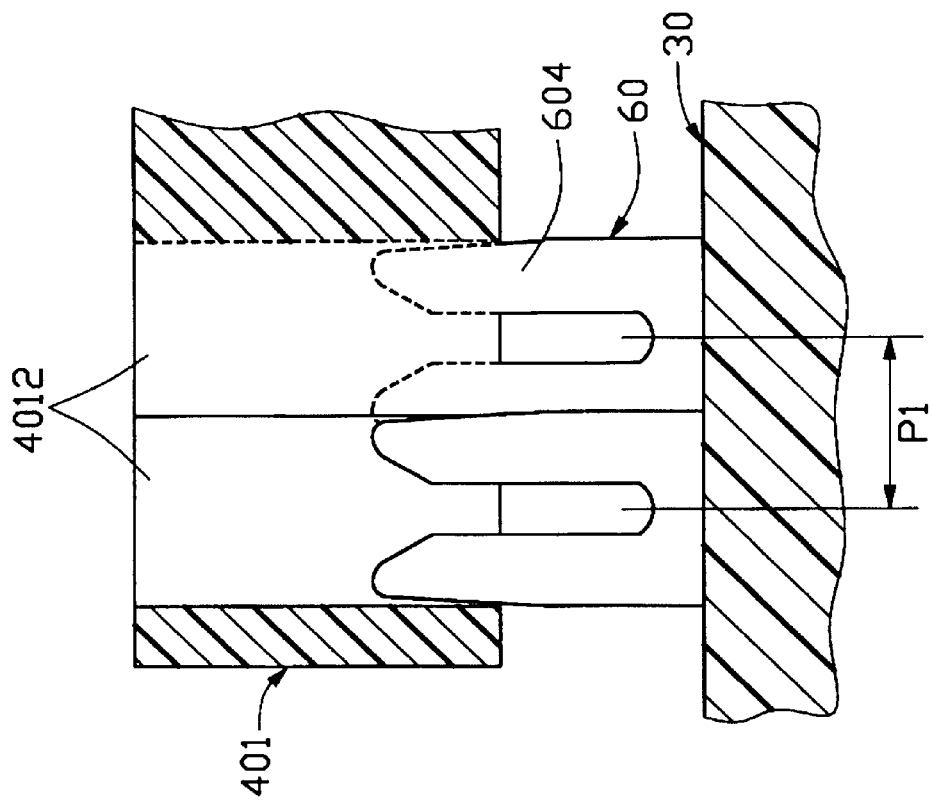
FIGS. 4A–4B are partially cross-sectional views of the electrical connector shown in FIG. 1 indicating a tail of each terminal of the connector is being inserted into the transmission board.
Figure 4B:
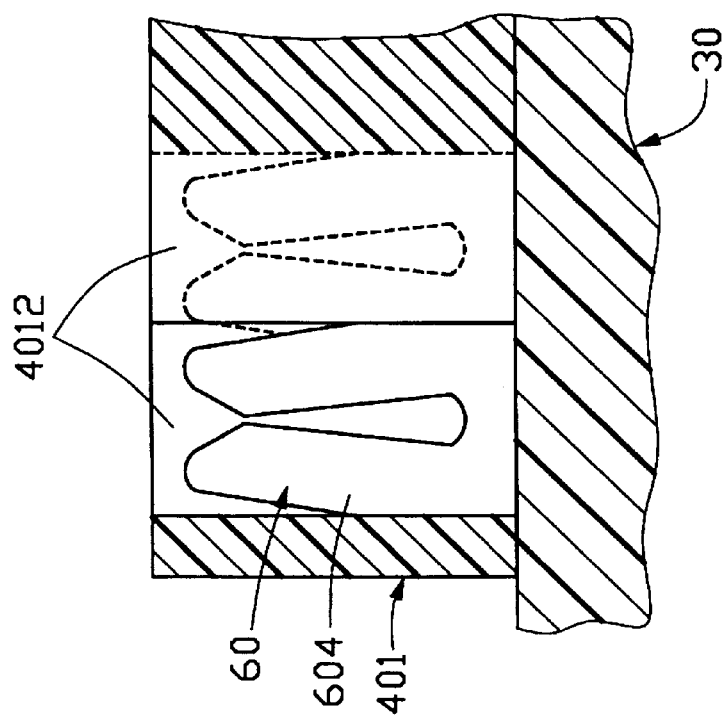
Figure 4C:
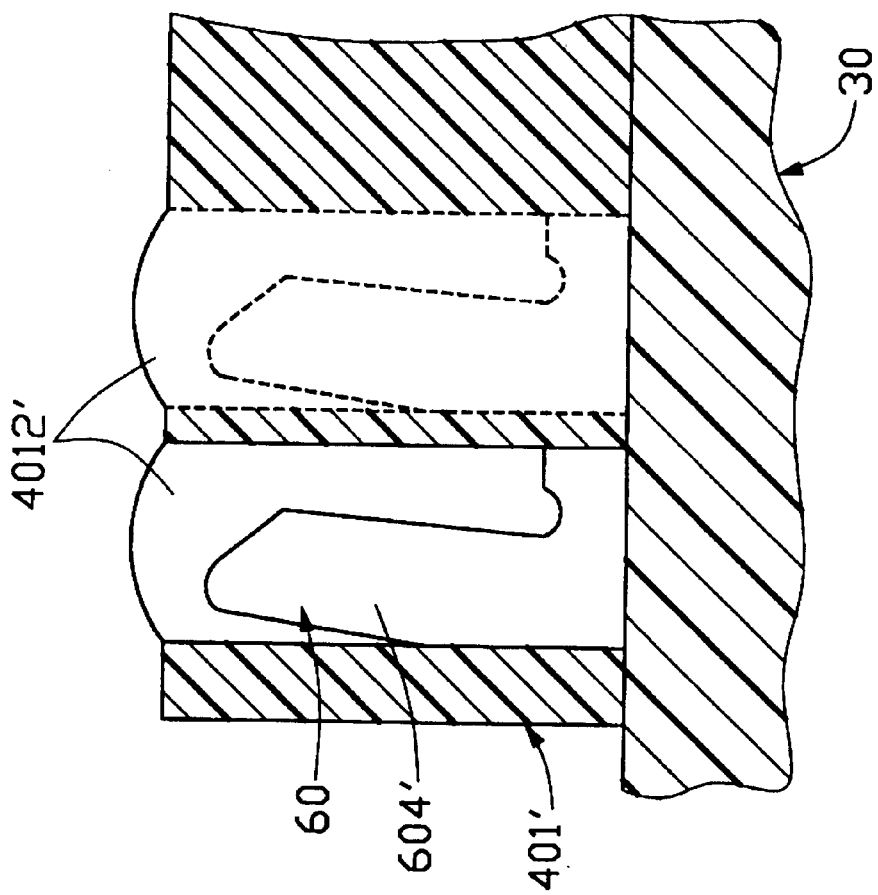
FIG. 4C is a partially cross-sectional view of an electrical connector of a second embodiment in accordance with the present invention showing a single pin of another terminal.

In assembly, the wires 701 are divided into two bunches-to be respectively soldered with the corresponding second conductive regions 4014 of the transmission boards 401, 403 wherein the conductive segment of each of the wires 701 is inserted into the first hole of the corresponding second conductive region 4014. Therefore, the transmission boards 401, 403 are stepwise attached into the wires 701 as shown in FIG. 3. Then, the stepped transmission board 401, 403 accompanied with the wires 701 are located at a position confronting with the stepped joint surfaces 3042, 3044 of the joint portion 304 of the housing 30 thereby aligning the first holes of the first conductive regions 4012 with the tail sections 604 of the terminals 60 of the housing 30. As shown in FIGS. 4A–4B, the tail sections 604 of the terminals 60 can be therefore inserted into the first holes of the transmission boards 401, 403, respectively and soldered therewith together.

Figure 5:
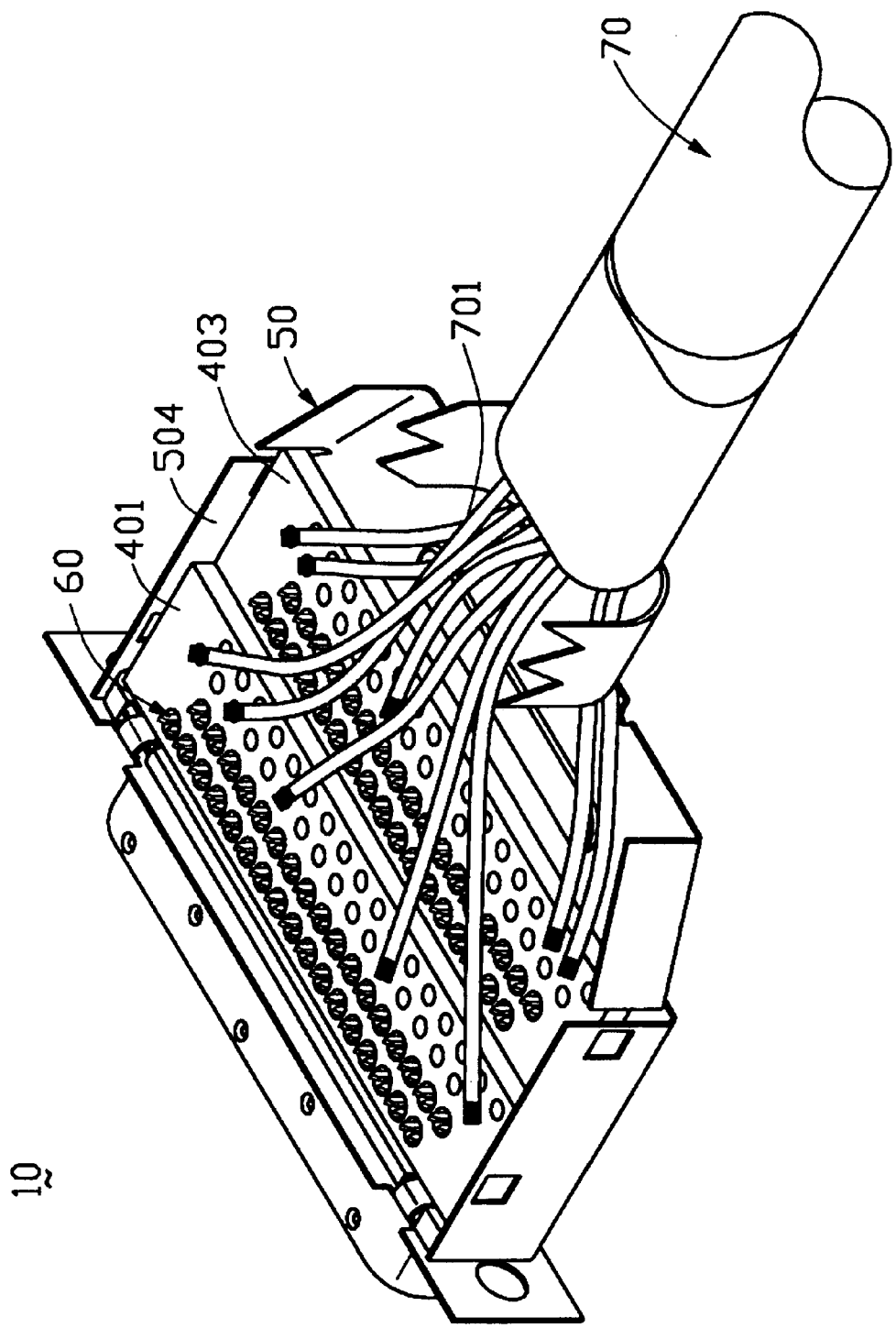
FIG. 5 is an assembled perspective view of the electrical connector shown in FIG. 1.

As the result shown in FIG. 5, the transmission boards 401, 403 fixedly attached onto the housing 30 are further positioned inside the receiving space 504 of the side cover 50 thereby shielding the electrical contact of the transmission boards 401, 403 with both the terminals 60 and wires 701. In the meantime, the wires 701 are tightly held by the wire harness 506 of the side cover 50 to prevent the wires 701 from removing out of the connector. Beside, the front shelter 20 receives the mating portion 302 of the housing 30 thereby shielding the electrical connection of the contact sections 602 of the terminals 60 with the mating electrical connector (not shown). An outermost insulative layer (not shown) for the well-insulated effect can be optionally molded out of the electrical connector 10 to enclose the housing 30, the side cover 50 and the conductive segments of the wires 701.

As illustrated in FIG. 4C, the second embodiment of the present invention indicates that the single-pin type tail sections 604' of the terminals 60' are respectively inserted into the first holes of the first conductive regions 4012' thereby being soldered therewith together.

Hence, in comparison with the prior arts, the electrical connector 10 with the transmission boards 401, 403 in accordance with the present invention is adaptable to selectively link with the wires of different diameters like the 28 AWG or 30 AWG wires, without any modification to the terminal pitches of the electrical connector, and without the displacement of the spacer with other wider one.

While the present invention has been described with reference to the specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

I claim:

1. An electrical connector for electrically connecting a mating connector, comprising:
    an insulative housing having a mating portion and an joint portion at opposite ends;
    a plurality of terminals received within the insulative housing, each having a contact section located at the mating portion of the housing, and a tail section exposed outside the joint portion of the housing;
    a cover attached onto the housing to shield the tail sections of the terminals, forming thereon opposite walls and a receiving space defined between the walls, and
    at least a plate received inside the receiving space of the cover and located at a position confronting with the joint portion of the housing wherein the plate forms at least a first row of conductive regions arranged adjacent a front edge thereof in a first pitch and respectively electrically connected with the tails of the corresponding terminals, a second row of conductive regions arranged adjacent a rear edge thereof in a second pitch different from the first pitch, adaptable to be selectively electrically connected with wires of different diameters, and a plurality of circuit traces providing an electrical connection between the first row of the conductive regions and the second row of the conductive regions;

wherein a first hole is define through the plate ate each of the conductive regions of the first row, and a second hole is define through the plate ate each of the conductive regions of the second row;

wherein each first hole fixedly receives the tail section of the corresponding terminal therein, and each second hole fixedly receives the conductive segment of the corresponding wire therein.

2. The electrical connector as defined in claim 1, wherein the tail section of each terminal is a bifurcated tip.

3. The electrical connector as defined in claim 1, wherein the tail section of each terminal is a single pin tip.

4. The electrical connector as defined in claim 1, wherein two stepped joint surfaces are formed under the joint portion and extended through by the tail sections of the terminals, each joint surface confronts with the plate.

5. The electrical connector as defined in claim 1, wherein the conductive regions in the first row are alternatively arranged with respect to the conductive regions in the second row.

6. The electrical connector as defined in claim 1, wherein the number of the first row of the conductive regions is the same as the second row of the conductive regions.

7. The electrical connector as defined in claim 1, wherein the circuit traces are formed on a layer inside the plate.

8. The electrical connector as defined in claim 1, wherein the second pitch keeps each two adjacent wires away from each other.

* * * * *